(12) United States Patent
Mokuo et al.

(10) Patent No.: US 11,362,658 B2
(45) Date of Patent: Jun. 14, 2022

(54) PROXIMITY SENSOR AND DOOR HANDLE DEVICE INCLUDING THE SAME

(71) Applicant: HOSIDEN CORPORATION, Yao (JP)

(72) Inventors: Shigeki Mokuo, Minoh (JP); Yohei Sanada, Yao (JP)

(73) Assignee: Hosiden Corporation, Yao (JP)

( * ) Notice: Subject to any disclaimer, the term of this patent is extended or adjusted under 35 U.S.C. 154(b) by 230 days.

(21) Appl. No.: 16/750,405

(22) Filed: Jan. 23, 2020

(65) Prior Publication Data

US 2020/0252063 A1 Aug. 6, 2020

(30) Foreign Application Priority Data

Feb. 5, 2019 (JP) .............................. JP2019-018437

(51) Int. Cl.
*H03K 17/955* (2006.01)
*E05B 81/76* (2014.01)

(52) U.S. Cl.
CPC .......... *H03K 17/955* (2013.01); *E05B 81/76* (2013.01); *E05B 81/77* (2013.01); *H03K 2217/960755* (2013.01)

(58) Field of Classification Search
CPC ..... H03K 17/955; H03K 2217/960755; H03K 2217/94036; H03K 2217/960705; E05B 81/77; E05B 81/76; E05B 17/22; E05B 1/00; E05B 85/10
See application file for complete search history.

(56) References Cited

U.S. PATENT DOCUMENTS

| 8,408,610 B2* | 4/2013 | Ieda ........................ E05B 77/34 |
| | | 292/336.3 |
| 9,033,379 B2* | 5/2015 | Tateishi .................. E05B 85/16 |
| | | 292/336.3 |
| 2018/0217711 A1* | 8/2018 | Teranishi .......... G06F 3/041662 |

FOREIGN PATENT DOCUMENTS

JP          2005098030 A        4/2005

* cited by examiner

*Primary Examiner* — Amy He
(74) *Attorney, Agent, or Firm* — Kilyk & Bowersox, P.L.L.C.

(57) ABSTRACT

A proximity sensor including a first substrate, a second substrate, a first connecting member, at least one first electrode, and a detection part. The first substrate is disposed in the vicinity of a first detection space. The second substrate is disposed on an opposite side of the first substrate to the first detection space. The second substrate faces the first substrate. The first connecting member connects the first substrate and the second substrate. The at least one first electrode is provided on the first substrate and configured such that a signal from the at least one first electrode changes in response to a change in a first capacitance caused by a detection target approaching to the first detection space. The detection part is provided on the second substrate and configured to detect the approach of the detection target based on the signal from the at least one first electrode.

20 Claims, 8 Drawing Sheets

PROXIMITY SENSOR AND DOOR HANDLE DEVICE INCLUDING THE SAME

CROSS-REFERENCE TO RELATED APPLICATION

The present application claims priority under 35 U.S.C. § 119 of Japanese Patent Application No. 2019-018437 filed on Feb. 5, 2019, the disclosure of which is expressly incorporated by reference herein in its entirety.

BACKGROUND OF THE INVENTION

Technical Field

The invention relates to proximity sensors and door handle devices including the same.

Background Art

A conventional door handle device is described in Japanese Unexamined Patent Application Publication No. 2005-98030. The door handle device includes a capacitive proximity sensor. This proximity sensor includes a substrate, a pair of electrodes, and a circuit part. The substrate has a first face facing the inner side (that is, a sensing side) of a door handle, and a second face opposite to the first face. The electrodes are provided on the first face of the substrate. The circuit part is provided on the second face of the substrate and detects a change in a capacitance between the electrodes.

SUMMARY OF INVENTION

The proximity sensor is built in the handle part of the door handle device, and the substrate of the proximity sensor should accordingly have such outer dimensions as to allow the substrate to be accommodated in the handle part. Further, it is required to co-locate the electrodes, the circuit part, and wirings for these on the substrate. Therefore, the substrate provides only a limited, i.e. relatively small, region for providing the electrodes.

The invention provides a proximity sensor with a relatively large electrode region. The invention also provides a door handle device including such proximity sensor.

A proximity sensor according to an aspect of the invention includes a first substrate, a second substrate, a first connecting member, at least one first electrode, and a detection part. The first substrate is disposed in the vicinity of a first detection space. The second substrate is disposed on an opposite side of the first substrate to the first detection space. The second substrate faces the first substrate. The first connecting member connects the first substrate and the second substrate. The at least one first electrode is provided on the first substrate and configured such that a signal from the at least one first electrode changes in response to a change in a first capacitance caused by a detection target approaching to the first detection space. The detection part is provided on the second substrate and configured to detect the approach of the detection target based on the signal from the at least one first electrode.

The proximity sensor of this aspect is structured such that the at least one first electrode is provided on the first substrate, and that the detection part is provided on the second substrate. This structure is suitable to allow the first substrate to have a larger electrode region for providing the at least one first electrode, as compared to a case where both the first electrode and the detection part are co-located on a single substrate.

The first connecting member may be flexible. The proximity sensor of this aspect has reduced bending stress applied to the first connecting member.

The first connecting member may be disposed within a projected area of at least one of the first and second substrates, in plan view in a thickness direction of the first substrate. The proximity sensor of this aspect is downsized, as compared to the case where the first connecting member extends outside the projected areas of the first and second substrates.

The proximity sensor of any of the above aspects may further include a first encapsulating part. The first encapsulating part may encapsulate the at least one first electrode, the detection part, the first substrate, the second substrate, the at least one column, and at least part of the first connecting member.

The proximity sensor of any of the above aspects may further include a first housing; and a second housing. The first and second housings may be configured to house the at least one first electrode, the detection part, the first substrate, the second substrate, and the first connecting member. The first and second housings may further house the first encapsulating part encapsulating the at least one first electrode, the detection part, the first substrate, the second substrate, and the first connecting member.

The proximity sensor may further include a protective cover fixed to the first encapsulating part.

The protective cover may include at least one column extending through the second substrate and the first substrate. In this case, the first encapsulating part may also encapsulate the at least one column. During fabrication of the proximity sensor of this aspect, particularly when the at least one first electrode, the detection part, the first substrate, the second substrate, the at least one column, and the at least part of the first connecting member are embedded in the first encapsulating part in a melted or soft state, the at least one column serves to fix the second substrate and the first substrate in predetermined positions. This arrangement reduces the possibility that the second substrate and/or the first substrate are displaced from the predetermined positions during the embedding process.

The first encapsulating part and the protective cover of any of the above aspects may be held between, and pressed by, the first housing and the second housing. In this case, the protective cover may be located closer to the second housing than the first encapsulating part is. In the proximity sensor of this aspect, the first encapsulating part and the protective cover are pressed by the first and second housings, in other words, subjected to loads from the first and second housings. However, the load from the second housing is distributed to the protective cover and the first encapsulating part so as to reduce the stress arising in the first encapsulating part due to such load.

The proximity sensor of any of the above aspects may further include at least one second electrode. The at least one second electrode may be configured such that a signal from the at least one second electrode changes in response to a change in a second capacitance caused by a detection target approaching to the second detection space different from the first detection space. The first and second housings may be configured to house the at least one first electrode, the detection part, the first substrate, the second substrate, the first connecting member, and the at least one second electrode. The first detection space may be located outside the first housing. The second detection space may be located outside the second housing. The detection part may be configured to detect an approach of the detection target based on the signal from the at least one second electrode. The at least one second electrode may be fixed to, or in abutment with, a part of an inner face of the second housing that corresponds to the second detection space. In the proximity sensor of this aspect, the at least one second electrode is located relatively close to the second detection space because the at least one second electrode is fixed to, or in abutment with, the part of the inner face of the second housing that corresponds to the second detection space. This arrangement improves the accuracy of the proximity sensor in detecting a detection target in the second detection space.

The proximity sensor of any of the above aspects may further include a third substrate, a second connecting member, and a second encapsulating part. The second connecting member may connect the second substrate and the third substrate. The third substrate may be provided with the at least one second electrode. The second encapsulating part may at least encapsulate a joint connecting the third substrate and the second connecting member. The proximity sensor of this aspect provides improved waterproofness because the second encapsulating part at least encapsulates the joint connecting the third substrate and the second connecting member.

The proximity sensor of any of the above aspects may further include at least one third electrode. The at least one third electrode may be provided on the first substrate. The at least one third electrode may be configured such that a signal from the at least one first electrode changes in response to a change in the first capacitance between the at least one first electrode and the detection target and/or a change in the first capacitance between the at least one first electrode and the at least one third electrode.

The first substrate may have a first face facing the first detection space and a second face opposite to the first face. The at least one first electrode may be provided on the first face of the first substrate. The at least one third electrode may be provided on the second face of the first substrate so as to overlap the at least one first electrode in plan view in a thickness direction of the first substrate. In the proximity sensor of this aspect, the existence of the at least one third electrode reduces the possibility of unwanted electrostatic coupling of the at least one first electrode to a dielectric member (such as a user's hand) or metal member that is present on the opposite side of the proximity sensor from the first detection space.

The door handle device of an aspect of the invention is fixed to a door. This device includes the proximity sensor of any of the above aspects. The first detection space is located between the door and the door handle device.

BRIEF DESCRIPTION OF DRAWINGS

The present invention can be even more fully understood with the reference to the accompanying drawings which are intended to illustrate, not limit, the present invention.

DESCRIPTION OF EMBODIMENTS

The following discussion is directed to a door handle device H according to various embodiments including a first embodiment of the invention. FIGS. 1 to 5 show the door handle device H of the first embodiment.

The door handle device H is attachable to a door D of a vehicle, a building, etc. Between the door handle device H and the door D there is provided a clearance for receiving a detection target, such as a hand of a user (see FIGS. 1 and 2A). The door handle device H includes a proximity sensor S (hereinafter also referred to simply as a sensor S) capable of detecting a detection target inserted into the clearance. This clearance will be referred to as a first detection space E1 of the proximity sensor S.

Figure 1:
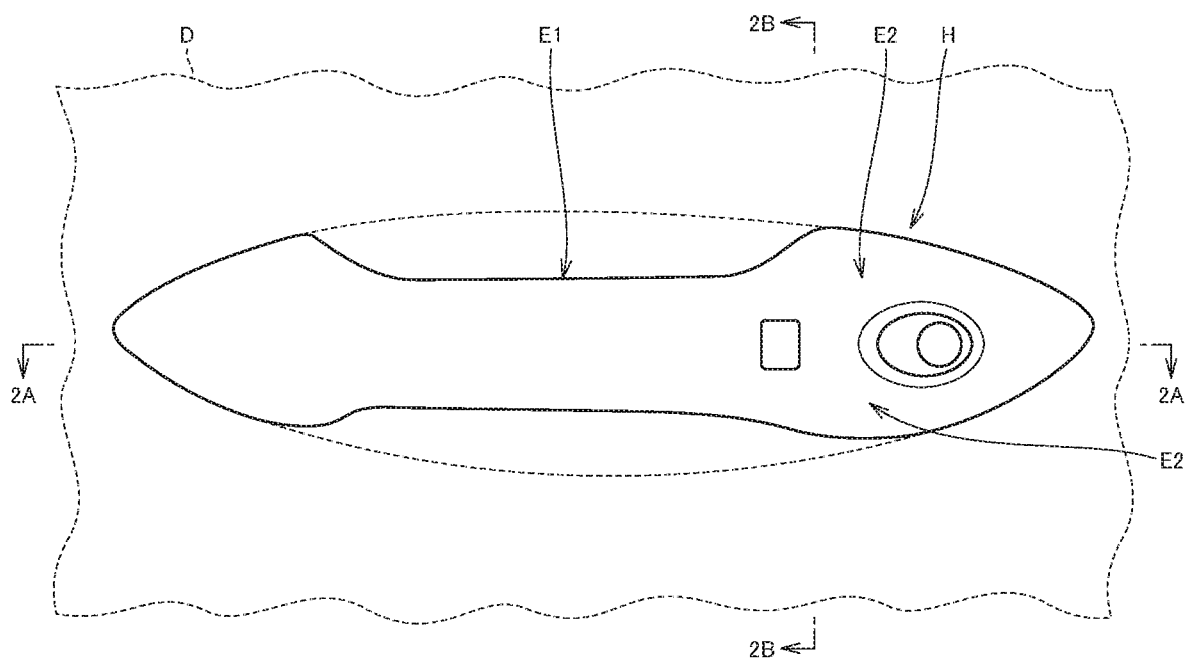
FIG. 1 is a schematic side view of a door handle device according to a first embodiment of the invention and a part of a door to which the door handle device is attached.
Figure 2A:
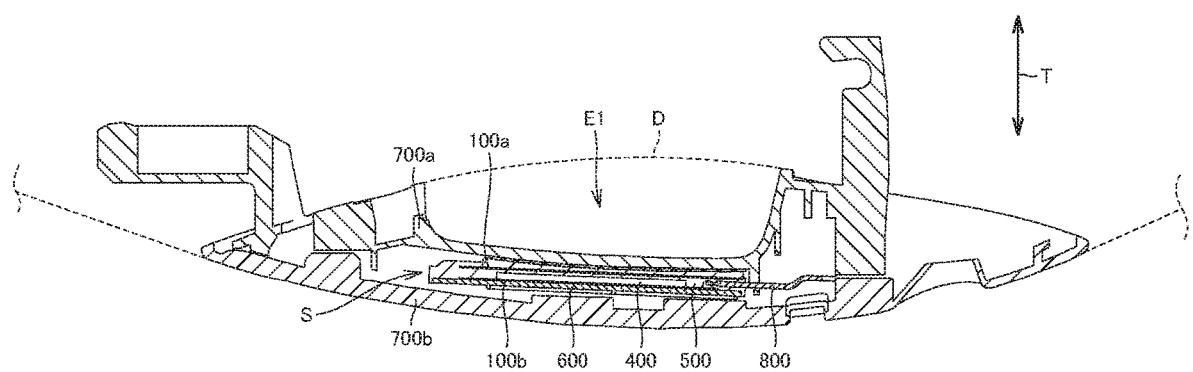
FIG. 2A is a cross-sectional view of the door handle device and the part of the door, taken along line 2A-2A in FIG. 1.
Figure 2B:
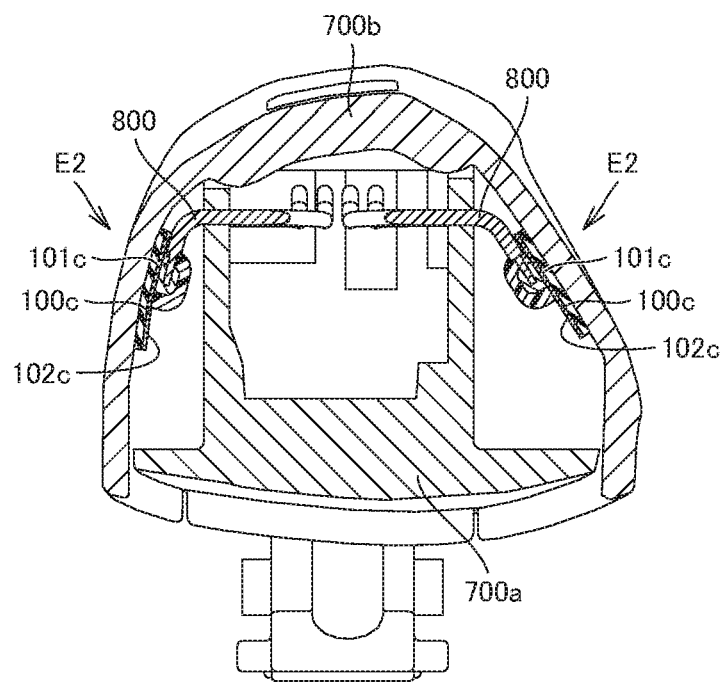
FIG. 2B is a cross-sectional view of the door handle device, taken along line 2B-2B in FIG. 1.
Figure 2B:
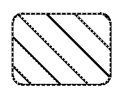
Figure 3A:
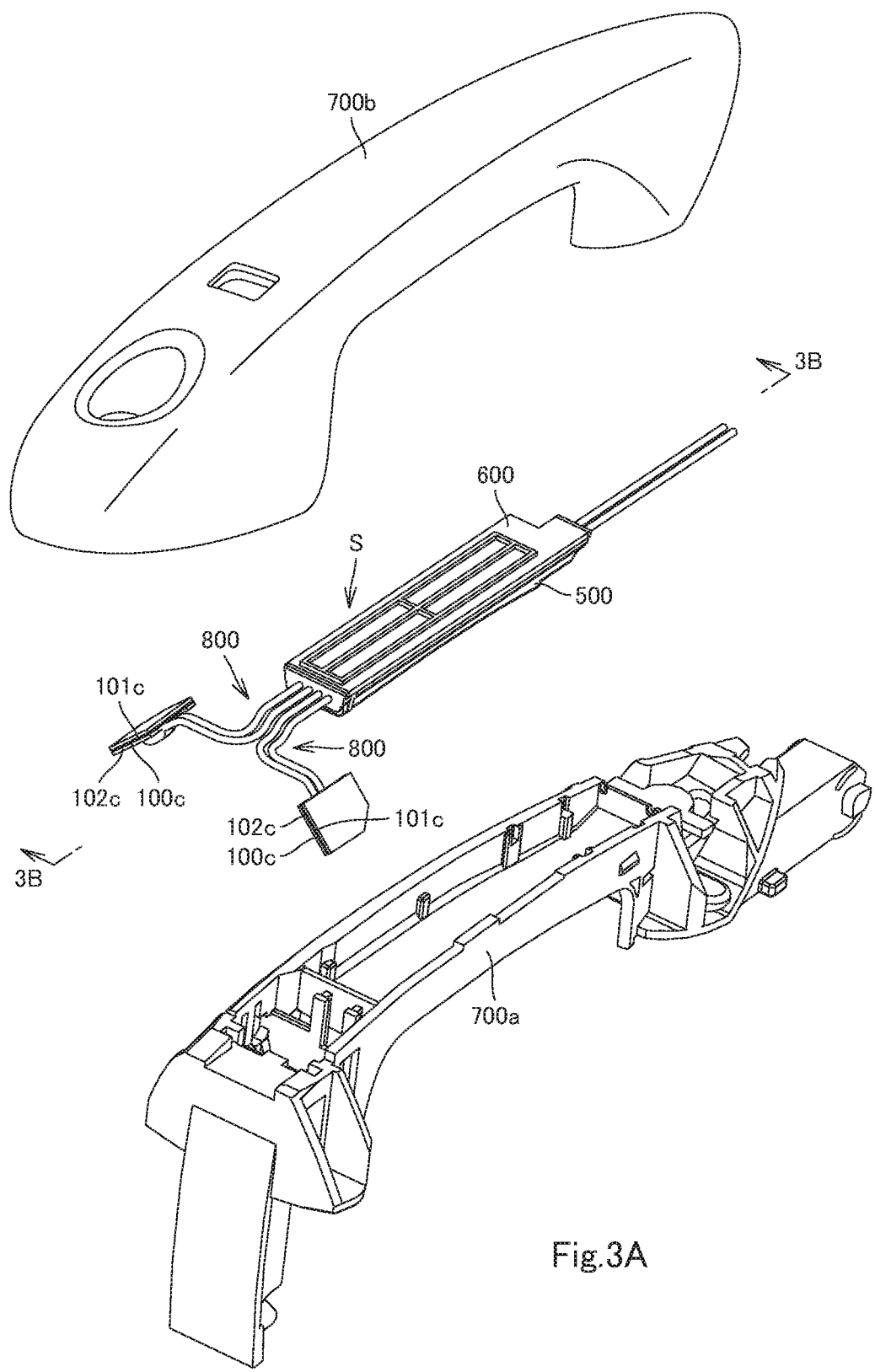
FIG. 3A is an exploded perspective view of the door handle device.
Figure 3B:
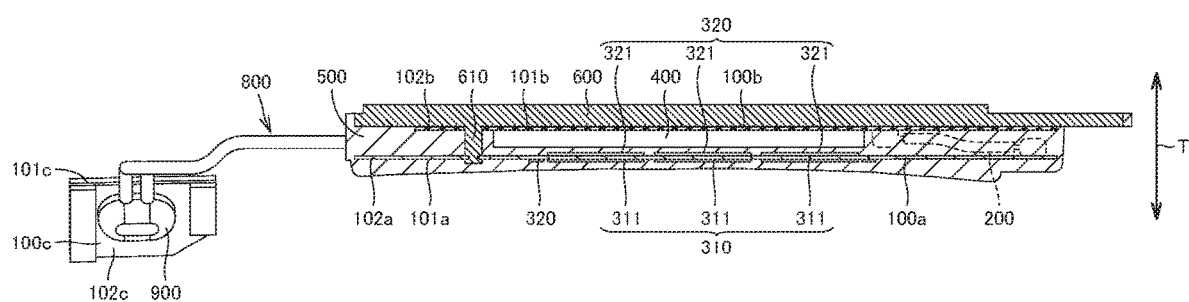
FIG. 3B is a cross-sectional view of a proximity sensor of the door handle device, taken along line 3B-3B in FIG. 3A.

The sensor S includes a substrate 100*a* (corresponding to a first substrate), a substrate 100*b* (corresponding to a second substrate), and a first connecting member 200. The substrate 100*a* is arranged in the vicinity of the first detection space E1. The substrate 100*a* has a first face 101*a* facing the first detection space E1, and a second face 102*a* opposite to the first face 101*a*. FIGS. 2A and 3B indicates the thickness direction T of the substrate 100*a*.

The substrate 100*b* has a first face 101*b* and a second face 102*b* opposite to the first face 101*b*. The substrate 100*b* is arranged on the opposite side of the substrate 100*a* to the first detection space E1 and faces to the substrate 100*a*. The first face 101*b* of the substrate 100*b* faces, and is spaced from, the second face 102*a* of the substrate 100*a*.

The first connecting member 200 connects the substrate 100*a* and the substrate 100*b*. The first connecting member 200 may preferably be flexible. For example, the first connecting member 200 may be a flexible lead wire, a flexible cable, a flexible substrate, or the like. The first connecting member 200 may preferably be disposed within a projected area of at least one of the substrate 100*a* and the substrate 100*b* in plan view in the thickness direction T. In this case, the first connecting member 200 may be disposed between the first face 101*b* of the substrate 100*b* and the second face 102*a* of the substrate 100*a*. Alternatively, the first connecting member 200 may be a rigid pin or the like member that is not flexible, and/or at least part of the first connecting member 200 may be located outside the projected area of the substrate 100*a* and/or outside the projected area of the substrate 100*b* in the plan view.

The sensor S may have configuration (1), i.e., may further include at least one electrode 310 (at least one first electrode). The sensor S may alternatively have configuration (2), i.e., may further include at least one electrode 310 (at least one first electrode) and at least one electrode 320 (at least one third electrode).

Where the sensor S has configuration (1), the electrode 310, or each of the plurality of electrodes 310, is a detection electrode for self-capacitive sensing. The electrode or electrodes 310 are provided on at least one of the first face 101*a* and the second face 102*a* of the substrate 100*a*. The electrode or electrodes 310 are electrically charged and discharged at regular intervals. When a detection target enters the first detection space E1 and approaches the electrode or electrodes 310 being electrically charged and discharged, the capacitance (a first capacitance) between the electrode 310 or each electrode 310 and the detection target changes (increases), and this capacitance change accordingly changes a signal (voltage or current) from the electrode 310 or each electrode 310.

Configuration (2) of the sensor S may specifically be configuration (2-1) or (2-2) below.

(2-1) The electrode 310, or each of the plurality of electrodes 310, is a detection electrode for mutual-capacitive sensing (Rx electrode). The electrode or electrodes 310 is provided on at least one of the first face 101a and the second face 102a of the substrate 100a. The electrode 320, or each of the plurality of electrodes 320, is a drive electrode for mutual-capacitive sensing (Tx electrode). The electrode or electrodes 320 are provided on at least one of the first face 101a and the second face 102a of the substrate 100a. The electrodes 310 and 320 are arranged such that the electrode 320 or each electrode 320, when supplied with a drive pulse at regular intervals, is electrostatically coupled to the electrode 310 or at least one of the electrodes 310. For example, the electrodes 310 and 320 may have one of the following arrangements (A), (B), or (C).

(A) The electrode or electrodes 310 are provided on one of the first face 101a or the second face 102a of the substrate 100a, and the electrode or electrodes 320 are provided on the other face 102a or 101a of the substrate 100a. The electrode 320 or each electrode 320 at least partially overlaps the electrode 310 or a respective electrode 310 in the thickness direction T of the substrate 100a. Alternatively, the electrode 320 or each electrode 320 at least partially overlaps the plurality of electrodes 310, or more than one of the plurality of the electrodes 310, in the thickness direction T of the substrate 100a.

(B) The electrode or electrodes 310 and the electrode or electrodes 320 are provided on the same one of the first face 101a and the second face 102a of the substrate 100a. The electrode 310 or each electrode 310 is located next to the electrode 320 or a respective electrode 320 in the plan view in the thickness direction T. Alternatively, the electrode 320 or each electrode 320 is located next to the plurality of electrodes 310, or more than one of the plurality of the electrodes 310, in the thickness direction T of the substrate 100a.

(C) The electrode or electrodes 310 are provided on one of the first face 101a or the second face 102a of the substrate 100a, and the electrode or electrodes 320 are provided on the other face 102a or 101a of the substrate 100a. The electrode 310 or each electrode 310 is located next to the electrode 320 or a respective electrode 320 in the plan view in the thickness direction T. Alternatively, the electrode 320 or each electrode 320 is located next to the plurality of electrodes 310, or more than one of the plurality of the electrodes 310, in the thickness direction T of the substrate 100a.

Where a single electrode 320 is provided to be electrostatically coupled to one or a plurality of electrodes 310, when a detection target enters the first detection space E1 and approaches the electrode 320 and the electrode or electrodes 310 while the electrode 320 is supplied with a drive pulse, the capacitance (a first capacitance) between such approached electrodes 320 and 310 changes. This capacitance change (decrease) accordingly changes a signal (voltage or current) from the electrode 310 or each approached electrode 310.

Where a plurality of electrodes 320 is provided to be each electrostatically coupled to the electrode 310 or one of the electrodes 310, when a detection target enters the first detection space E1 and approaches at least one of the electrodes 320 and the corresponding electrode or electrodes 310 while each electrode 320 is supplied with a drive pulse, the capacitance (a first capacitance) between such approached electrodes 320 and 310 changes. This capacitance change (decrease) accordingly changes a signal (voltage or current) from the approached electrode 310 or each approached electrode 310.

Where a plurality of electrodes 320 is provided to be each electrostatically coupled to more than one (a set) of the electrodes 310, when a detection target enters the first detection space E1 and approaches at least one of the electrodes 320 and the corresponding set or sets of electrodes 310 while each electrode 320 is supplied with a drive pulse, the capacitance (a first capacitance) between such approached electrodes 320 and 310 changes. This capacitance change (decrease) accordingly changes a signal (voltage or current) from the set of approached electrodes 310 or each set of approached electrodes 310.

(2-2) The electrode 310 or each electrode 310 serves as a detection electrode for self-capacitive sensing and also as a detection electrode (Rx electrode) for mutual-capacitive sensing. The electrode or electrodes 310 are provided on at least one of the first face 101a and the second face 102a of the substrate 100a. The electrode 320 or each electrode 320 serves as a drive electrode (Tx electrode) for mutual-capacitive sensing. The electrode or electrodes 320 are provided on at least one of the first face 101a and the second face 102a of the substrate 100a. The electrodes 310 and 320 are arranged in the same positional relationship as described earlier in relation to configuration (2-1).

If a detection target enters the first detection space E1 while the electrode 310 or each electrode 310 is electrically charged and discharged, then the signal (voltage or current) from the single electrode 310, or one of the electrodes 310 that the detection target has approached, changes in the manner as described earlier in relation to configuration (1). If a detection target enters the first detection space E1 while the electrode 320 or each electrode 320 is supplied with a drive pulse, a signal (voltage or current) from the electrode 310 or each electrode 310 approached by the detection target changes in one of the manners described earlier in relation to configuration (2-1).

Figure 4A:
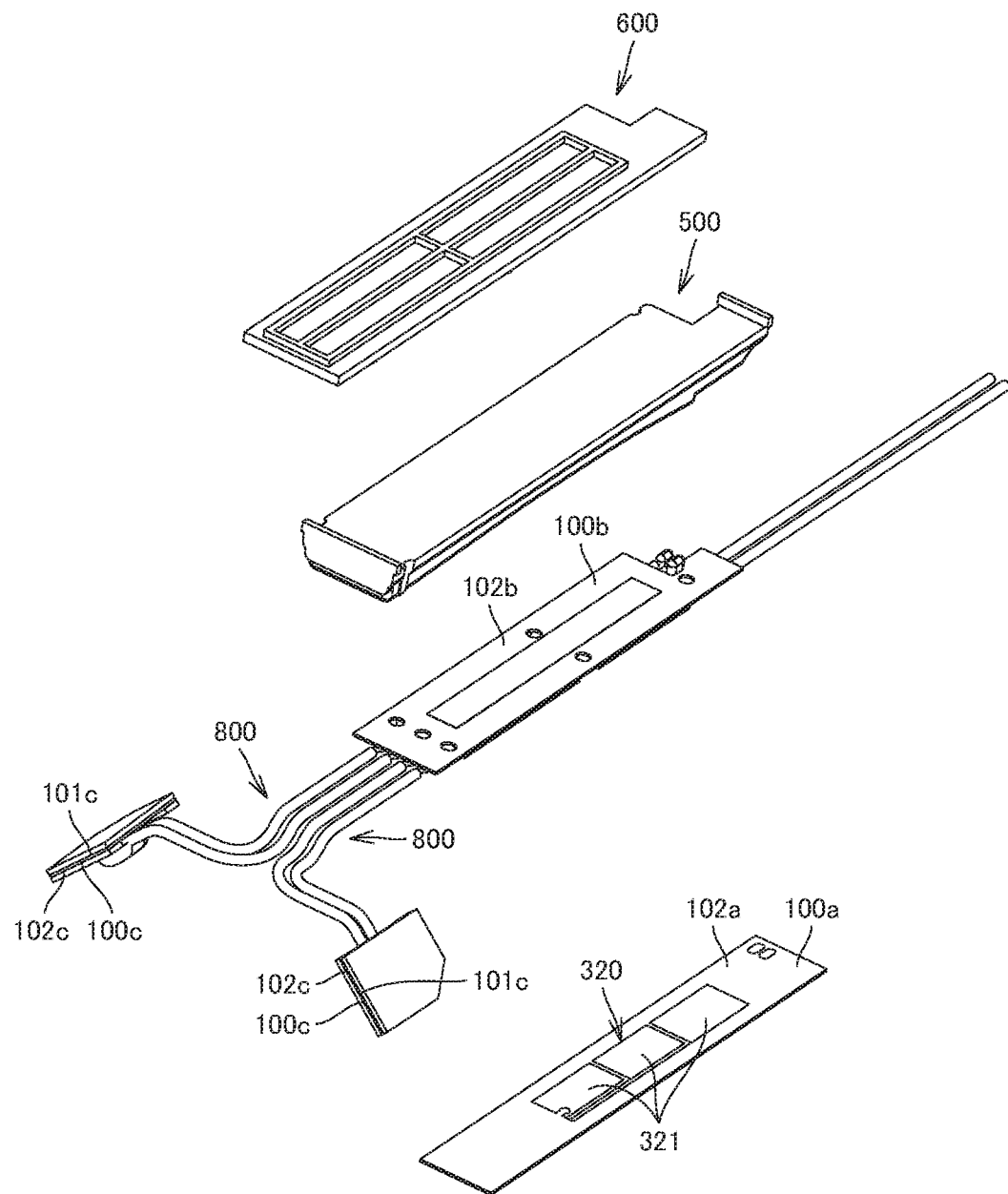
FIG. 4A is an exploded front, top, right side perspective view of the proximity sensor of the door handle device.
Figure 4B:
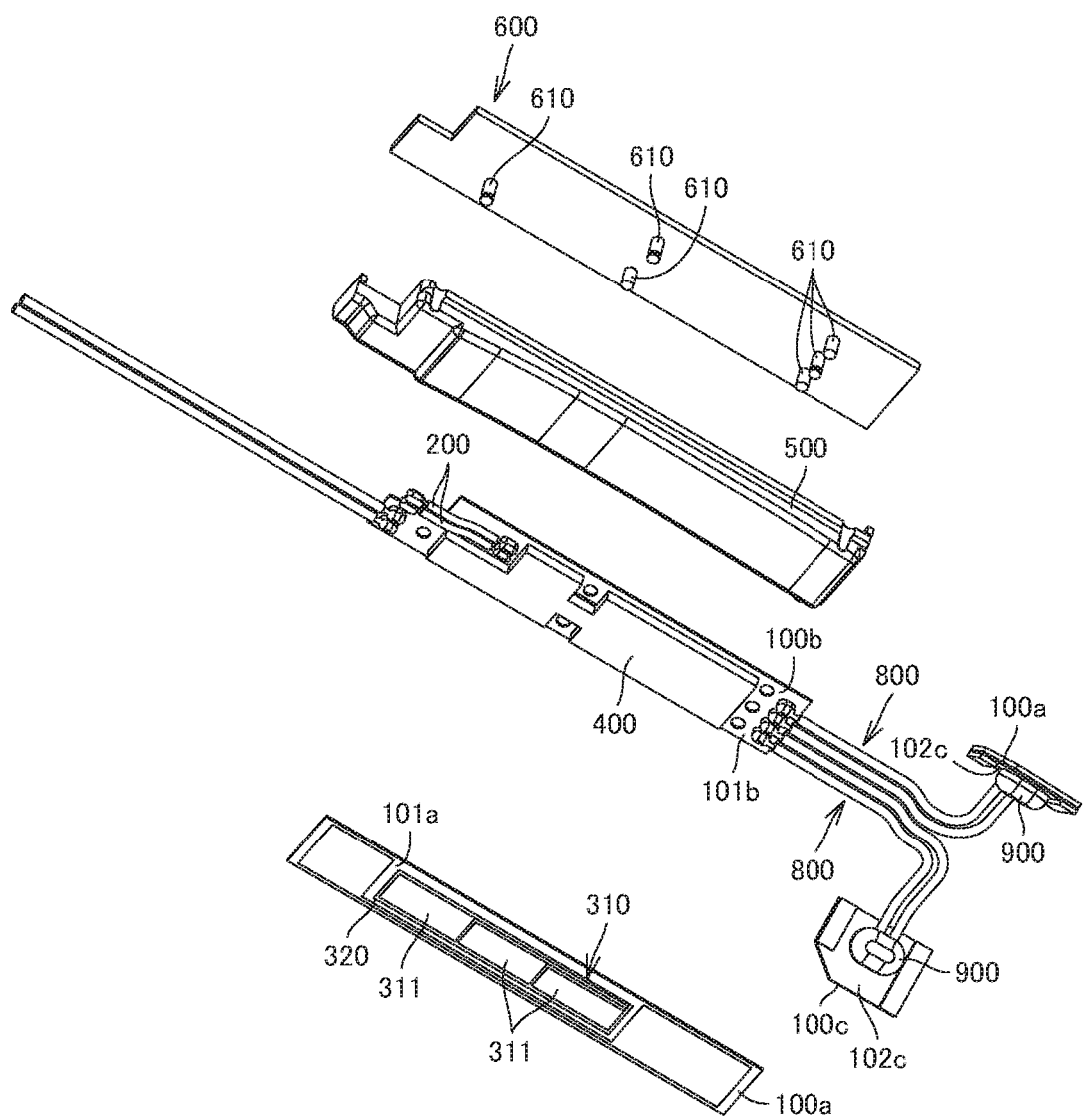
FIG. 4B is an exploded rear, bottom, left side perspective view of the proximity sensor of the door handle device.

In an embodiment as shown in FIGS. 4A and 4B, a single electrode 310 is provided to serve as a detection electrode for self-capacitive sensing and also as a detection electrode (Rx electrode) for mutual-capacitive sensing, and two electrodes 320 are provided to serve as drive electrodes (Tx electrodes) for mutual-capacitive sensing. The electrode 310 is divided into three sub-electrodes 311 electrically connected to each other. The sub-electrodes 311 are provided, at spaced intervals, on the first face 101a of the substrate 100a. One of the two electrodes 320 is divided into three sub-electrodes 321 electrically connected to each other. The sub-electrodes 321 are provided, at spaced intervals, on the second face 102a of the substrate 100a such as to overlap the respective sub-electrodes 311 in the thickness direction T. The remaining one electrode 320 is a ring-shaped electrode surrounding the sub-electrodes 311 on the first face 101a of the substrate 100a. The electrode 310 on the first face 101a can be electrostatically coupled to the electrode 320 on the second face 102a. The electrode 310 on the first face 101a can also be electrostatically coupled to the ring-shaped electrode 320 on the first face 101a.

The sensor S further includes a detection part 400. The detection part 400 is provided on the first face 101b or the second face 102b of the substrate 100b. Where the detection part 400 is provided on the first face 101b, the detection part 400 may be located between the first face 101b of the substrate 100b and the second face 102a of the substrate 100a. The detection part 400 is embodied by a logic circuit, such as an IC, or alternatively by software to be processed by a processor, for example.

Where the sensor S has configuration (1) described above, the detection part 400 has the following configuration. The detection part 400 electrically charges and discharges the electrode 310 or each electrode 310 at regular intervals and monitors a signal from the electrode 310 or each electrode 310. The detection part 400 has a memory storing a first threshold value, and compares the first threshold value with the signal from the electrode 310 or each electrode 310. When the signal from the electrode 310, or from at least one of the electrodes 310, changes by the first threshold value or larger, the detection part 400 determines that the detection target has approached the electrode or electrodes 310 outputting such signal or signals (i.e., determines that the detection target has entered the first detection space E1).

Where the sensor S has configuration (2-1) described above, the detection part 400 has the following configuration. The detection part 400 supplies a drive pulse to the electrode 320 or each electrode 320 at regular intervals and monitors a signal from the electrode 310 or each electrode 310. The detection part 400 has a memory storing a second threshold value, and compares the second threshold value with the signal from the electrode 310 or each electrode 310. When the signal from the electrode 310, or from at least one of the electrodes 310, changes by the second threshold value or larger, the detection part 400 determines that a detection target has approached the electrode or electrodes 310 outputting such signal or signals (i.e., determines that the detection target has entered the first detection space E1).

Where the sensor S has configuration (2-2) described above, the detection part 400 has the following configuration. The detection part 400 electrically charges and discharges the electrode 310 or each electrode 310 at regular intervals, supplies a drive pulse to the electrode 320 or each electrode 320 at regular intervals, and monitors a signal from the electrode 310 or each electrode 310. The detection part 400 has a memory storing a third threshold value, and compares the third threshold value with the signal from the electrode 310 or each electrode 310. It should be noted that the charge and discharge to the electrode 310 or each electrode 310 is conducted at a different timing from the supply of the drive pulse to the electrode 320 or each electrode 320. When the signal from the electrode 310, or from at least one of the electrodes 310, changes by the third threshold value or larger, the detection part 400 determines that a detection target has approached the electrode or electrodes 310 outputting such signal or signals (i.e., determines that the detection target has entered the first detection space E1).

In the various manners descried above, the detection part 400 detects a detection target entering the first detection space E1. In addition, it is preferable that an authentication device be provided inside a vehicle, a building, etc., and that a user possess an authentication key device storing authentication information. In this case, the authentication device may be configured to wirelessly communicate with the authentication key device and authenticate whether or not the user is an authentic user based on the authentication information in the authentication key device. It is preferable that the door handle device H open the door D if the detection part 400 detects a detection target entering the first detection space E1 within a predetermined period after the door handle device H receives information from the authentication device that the user is an authentic user.

The sensor S may further include a first encapsulating part 500. The first encapsulating part 500 is made of a hardened hot-melt adhesive or other adhesive, molded plastic material, or the like material. The first encapsulating part 500 has a first face and a second face opposite to the first face. The first face of the first encapsulating part 500 faces the first detection space E1.

Where the sensor S has configuration (1) described above, the at least one electrode 310, the detection part 400, the substrate 100a, and the substrate 100b may be encapsulated in the first encapsulating part 500, and at least part of the first connecting member 200 may also be encapsulated in the first encapsulating part 500. During the fabrication of the sensor S, the at least one electrode 310, the detection part 400, the substrate 100a, and the substrate 100b, and at least part of the first connecting member 200 may be embedded in the first encapsulating part 500 in a melted or soft state, and then the first encapsulating part 500 may be solidified, e.g. by cooling the adhesive or plastic material.

Where the sensor S has configuration (2-1) or (2-2) described above, the at least one electrode 310, the at least one electrode 320, the detection part 400, the substrate 100a, and the substrate 100b may be encapsulated in the first encapsulating part 500, and at least part of the first connecting member 200 may also be encapsulated in the first encapsulating part 500 (see FIGS. 2A and 3). During the fabrication of the sensor S, the at least one electrode 310, the at least one electrode 320, the detection part 400, the substrate 100a, the substrate 100b, and at least part of the first connecting member 200 may be embedded in the first encapsulating part 500 in a melted or soft state, and then the first encapsulating part 500 may be solidified, e.g. by cooling the adhesive or plastic material.

In either case, the above encapsulated components are covered by the first encapsulating part 500 without clearance therebetween and are unexposed to the outside of the first encapsulating part 500. It should be appreciated that the first encapsulating part 500 may be omitted.

The sensor S may further include a protective cover 600. The protective cover 600 is fixed to the second face of the first encapsulating part 500 (see FIGS. 2A and 3B). The protective cover 600 may be provided with at least one column 610. The at least one column 610 extends from the protective cover 600 in the thickness direction T to extend through the substrate 100b and the substrate 100a. Specifically, the column 610 or each column 610 is inserted through a through-hole of the substrates 100b and then through a through-hole of the substrate 100a. During the fabrication of the sensor S, the at least one column 610 as inserted in the substrates 100b and 100a may be embedded in the first encapsulating part 500 in a melted or soft state together with the substrates 100b and 100a, and then the first encapsulating part 500 may be solidified, e.g. by cooling the adhesive or plastic material so as to encapsulate the at least one column 610 and the substrates 100b and 100a. The at least one column 610 may be omitted, or alternatively a plurality of columns 610 may be provided as shown in FIG. 4B. The protective cover 600 may be omitted.

The door handle device H may further include a first housing 700a and a second housing 700b. The first housing 700a may be attached to the door D, and the second housing 700b may be attached to the first housing 700a. In this case, the clearance for receiving a detection target (i.e., the first detection space E1) is provided between the first housing 700a and the door D. In other words, the first detection space E1 is provided outside the first housing 700a. The first housing 700a and the second housing 700b may accommodate the sensor S of any of the above aspects. Where the sensor S includes the first encapsulating part 500 and the protective cover 600, the first housing 700a and the second housing 700b may accommodate, and hold therebetween, the first encapsulating part 500 and the protective cover 600 of any of the above aspects so as to press them in the thickness direction T. The first face of the first encapsulating part 500 may be fixed to the first housing 700a with a double-sided adhesive tape, an adhesive, or the like. The protective cover 600 is located closer to the second housing 700b than the first encapsulating part 500 is. For this reason, even if the first encapsulating part 500 and the protective cover 600 are pressed as described above, the load from the second housing 700b is distributed to the protective cover 600 and the first encapsulating part 500 so as to reduce the stress arising in the first encapsulating part 500 due to such load. It should be noted that the first housing 700a and the second housing 700b also serve as the first and second housings of the sensor S, the first housing 700a and the second housing 700b correspond to the first housing and the second housing, respectively, in the claims.

The sensor S may further include a configuration for detecting a detection target (such as a hand of a user) in a second detection space E2. The second detection space E2 may preferably be provided outside the second housing 700b, for example. In this case, the sensor S may have configuration (3), i.e., may further include a substrate 100c (a third substrate), a second connecting member 800, and at least one electrode 330 (at least one second electrode). Alternatively, the sensor S may have a configuration (4), i.e., may further include a substrate 100c (a third substrate), a second connecting member 800, at least one electrode 330 (at least one second electrode), and at least one electrode 340.

Regardless of whether the sensor S has configuration (3) or (4) described above, the substrate 100c and the second connecting member 800 may have any of the following configurations. The substrate 100c may have a first face 101c and a second face 102c opposite to the first face 101c. The first face 101c of the substrate 100c may be in abutment with the second housing 700b or may be fixed to the second housing 700b with a double-sided adhesive tape, an adhesive, or the like. In an embodiment shown in FIGS. 2B, 3A, and 4A, the first face 101c of the substrate 100c is covered with a double-sided adhesive tape. The second connecting member 800 may connect the substrate 100c and the substrate 100b. The second connecting member 800 may preferably be flexible. For example, the second connecting member 800 may be a flexible lead wire, a cable, a flexible substrate, or the like. Alternatively, the second connecting member 800 may be an inflexible rigid member, such as a pin.

Where the sensor S has configuration (3) described above, the electrode or electrodes 330 have the same configuration as electrode or electrodes 310 of configuration (1) described above, except that the electrode or electrodes 330 are provided on at least one of the first face 101c and the second face 102c of the substrate 100c.

In this case, the detection part 400 further has the following configuration. The detection part 400 electrically charges and discharges the electrode 330 or each electrode 330 at regular intervals and monitors a signal from the electrode 330 or each electrode 330. The detection part 400 has a memory storing a fourth threshold value, and compares the fourth threshold value with the signal from the electrode 330 or each electrode 330. When a detection target enters the second detection space E2 and approaches the electrode or electrodes 330 being electrically charged and discharged, the capacitance (a second capacitance) between the electrode 330 or each electrode 330 and the detection target changes (increases), and this capacitance change accordingly changes a signal from the electrode 330 or each electrode 330 (voltage or current). When the signal from the electrode 330, or from at least one of the electrodes 330, changes by the fourth threshold value or larger, the detection part 400 determines that the detection target has approached the electrode or electrodes 330 outputting such signal or signals (i.e., determines that the detection target has entered the second detection space E2).

Where the sensor S has configuration (4) described above, the sensor S may have one of the following configurations (4-1) or (4-2).

Figure 5:
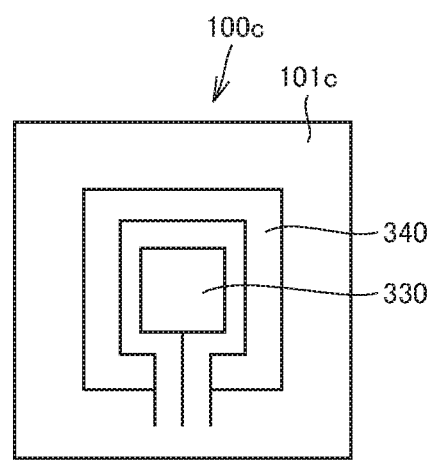
FIG. 5 is a view of a first face of a third substrate of the proximity sensor.

(4-1) The electrode or electrodes 330 may have the same configuration as the electrode or electrodes 310 of configuration (2-1) described above, except that the electrode or electrodes 330 are provided on at least one of the first face 101c and the second face 102c of the substrate 100c (see FIG. 5). The electrode or electrodes 340 may have the same configuration as the electrode or electrodes 320 of configuration (2-1) described above, except that the electrode or electrodes 340 are provided on at least one of the first face 101c and the second face 102c of the substrate 100c (see FIG. 5).

In this case, the detection part 400 further has the following configuration. The detection part 400 supplies a drive pulse to the electrode 340 or each electrode 340 at regular intervals and monitors a signal from the electrode 340 or each electrode 340. The detection part 400 has a memory storing a fifth threshold value, and compares the fifth threshold value with the signal from the electrode 340 or each electrode 340.

Where a single electrode 340 is provided, when a detection target enters the second detection space E2 and approaches the electrode 340 and one or a plurality of electrodes 330 that are electrostatically coupled to the electrode 340 while the electrode 340 or each electrode 340 is supplied with a drive pulse, the capacitance (a second capacitance) between such approached electrodes 340 and 330 changes. This capacitance change (decrease) accordingly changes a signal from the electrode 330 or each approached electrode 330.

Where a plurality of electrodes 340 is provided, when a detection target enters the first detection space E2 and approaches the electrodes 340 and the single electrode 330 or one of electrodes 330 that are electrostatically coupled to each electrode 340 while each electrode 340 is supplied with a drive pulse, the capacitance (a second capacitance) between such approached electrodes 340 and 330 changes. This capacitance change (decrease) accordingly changes a signal (voltage or current) from the approached electrode 330 or each approached electrode 330.

Where a plurality of electrodes 340 is provided, when a detection target enters the first detection space E2 and approaches the electrodes 340 and the electrodes 330 that are electrostatically coupled to each electrode 340 while each electrode 340 is supplied with a drive pulse, the capacitance (a second capacitance) between such approached electrodes 340 and 330 changes. This capacitance change (decrease) accordingly changes a signal (voltage or current) from the approached electrode 330 or each approached electrode 330.

When the signal from the electrode 330, or from at least one of the electrodes 330, changes by the fifth threshold value or larger, the detection part 400 determines that the detection target has approached the electrode or electrodes 330 outputting such signal or signals (i.e., determines that the detection target has entered the second detection space E2).

(4-2) The electrode or electrodes 330 may have the same configuration as the electrode or electrodes 310 of configuration (2-2) described above, except that the electrode or electrodes 330 are provided on at least one of the first face 101c and the second face 102c of the substrate 100c (see FIG. 5). The electrode or electrodes 340 may have the same configuration as the electrode or electrodes 320 of configuration (2-2) described above, except that the electrode or electrodes 340 are provided on at least one of the first face 101c and the second face 102c of the substrate 100c (see FIG. 5).

In this case, the detection part 400 further has the following configuration. The detection part 400 electrically charges and discharges the electrode 330 or each electrode 330 at regular intervals, supplies a drive pulse to the electrode 340 or each electrode 340 at regular intervals and monitors a signal from the electrode 330 or each electrode 330. The detection part 400 has a memory storing a sixth threshold value, and compares the sixth threshold value with the signal from the electrode 330 or each electrode 330. It should be noted that the charge and discharge to the electrode 310 or each electrode 310 is conducted at a different timing from the supply of the drive pulse to the electrode 320 or each electrode 320. If a detection target enters the second detection space E2 while the electrode 330 or each electrode 330 is electrically charged and discharged, then the signal (voltage or current) from the electrode 330, or at least one of the electrodes 330 that the detection target has approached, changes in the manner as described earlier in relation to configuration (3). If a detection target enters the second detection space E2 while the electrode 340 or each electrode 340 is supplied with a drive pulse, a signal (voltage or current) from the corresponding electrode, signals from the corresponding electrodes, or signals from the corresponding set of electrodes 330 approached by the detection target change in one of the manners described earlier in relation to configuration (4-1). When the signal from the electrode 330, or from at least one of the electrodes 330, changes by the sixth threshold value or larger, the detection part 400 determines that the detection target has approached the electrode 330 or electrodes 330 outputting such signal or signals (i.e., determines that the detection target has entered the second detection space E2).

In the various manners descried above, the detection part 400 detects a detection target entering the second detection space E2. The door handle device H may switch the door D between the locked state and the unlocked state if the detection part 400 detects a detection target entering the second detection space E2 within a predetermined period after the door handle device H receives information from the authentication device that the user is an authentic user.

Where the at least one electrode 330 and/or the at least one electrode 340 is provided on the first face 101c of the substrate 100c, the at least one electrode 330 and/or the at least one electrode 340 may be in abutment with a part corresponding to the second detection space E2 on the inner face of the second housing 700b or may be fixed to this part with a double-sided adhesive tape or an adhesive. This arrangement allows the at least one electrode 330 and/or the at least one electrode 340 to be located relatively close to the second detection space E2, and thereby improves the accuracy of the proximity sensor in detecting a detection target in the second detection space E2. It should be noted that clearance may be provided at least one of the electrodes 330 and 340 and the inner face of the second housing 700b.

Where two second detection spaces E2 are provided, the sensor S has one of the above configurations (3), (4-1), and (4-2) for detection in one of the two second detection spaces E2, and one of configurations (3), (4-1), or (4-2) described above for detection in the other second detection space E2. Also, the door handle device H may be configured to lock the door D when the detection part 400 detects a detection target entering one of the second detection spaces E2, and to unlock the door D when the detection part 400 detects a detection target entering the other second detection space E2, within a predetermined period after the door handle device H receives information from the authentication device that the user is an authentic user.

It should be appreciated that any of the above configurations (3), (4-1), and (4-2) may be omitted. In accordance with the omission of the above configurations (3), (4-1), and/or (4-2), the detection part 400 may be provided without any of the above additional configurations.

Where the sensor S has configuration (3) or (4) described above, the sensor S may further include a second encapsulating part 900. The second encapsulating part 900 may at least encapsulates a joint connecting the substrate 100c and the second connecting member 800 (such as a soldered part connecting therebetween). The second encapsulating part 900 may be a silicone adhesive. The second encapsulating part 900 may encapsulates the substrate 100c and the second connecting member 800 in their entirety. In this case, the second encapsulating part 900 may be made of the same material as the first encapsulating part 500. The second encapsulating part 900 may be omitted.

The sensor S and the door handle device H described above provide at least the following technical features and effects.

(I) The sensor S is structured such that the at least one electrode 310 is provided on the substrate 100a, and that the detection part 400 is provided on the substrate 100b. This structure is suitable to allow the substrate 100a to have a larger electrode region for providing the at least one electrode 310, or the at least one electrode 310 and the at least one electrode 320, as compared to a case where both the at least one electrode 310 and the detection part 400 are co-located on a single substrate. A larger electrode region of the substrate 100a makes it possible to enlarge the at least one electrode 310, or enlarge the at least one electrode 310 and the at least one electrode 320, to be provided on the electrode region of the substrate 100a. Therefore, the sensor S provides improved sensitivity in detecting a detection target in the first detection space E1.

(II) Where the first connecting member 200 is flexible, the sensor S has reduced bending stress applied to the first connecting member 200.

(III) Where the first connecting member 200 is disposed within the projected area of at least one of the substrate 100a and the substrate 100b in plan view in the thickness direction T, the sensor S is downsized, as compared to the case where at least part of the first connecting member 200 extends outside the projected areas of the substrate 100a and the substrate 100b.

(IV) The sensor S provides improved waterproofness because the first encapsulating part 500 and/or the second encapsulating part 900 are provided as follows.

Where the sensor S has the above configuration (1), the first encapsulating part 500 encapsulates the at least one electrode 310, the detection part 400, the substrate 100a, the substrate 100b, and at least part of the first connecting member 200. Where the sensor S has configuration (2-1) or (2-2) described above, the first encapsulating part 500 encapsulates the at least one electrode 310, the at least one electrode 320, the detection part 400, the substrate 100a, the substrate 100b, and at least part of the first connecting member 200. Where the sensor S has configuration (3) or (4) described above, the second encapsulating part 900 at least encapsulates the joint connecting the substrate 100c and the second connecting member 800 (such as the soldered part connecting therebetween)

(V) Where the sensor S includes the protective cover 600, and the first housing 700a and the second housing 700b press therebetween the protective cover 600 and the first encapsulating part 500, the load from the second housing 700b arising from such pressing is distributed to the protective cover 600 and the first encapsulating part 500. This arrangement reduces the stress arising in the first encapsulating part 500 due to such load.

(VI) Where the protective cover 600 is provided with the at least one column 610, the at least one column 610 extends through the substrate 100a and the substrate 100b. The at least one column 610 serves to fix the substrate 100a and the substrate 100b in predetermined positions during fabrication of the sensor S, particularly when the substrate 100a and the substrate 100b are embedded in the first encapsulating part 500 in a melted or soft state. This arrangement eliminates or reduces the possibility that the substrate 100a and the substrate 100b are displaced during the embedding process.

(VII) Where the sensor S includes the at least one electrode 310 and the at least one electrode 320, the at least one electrode 310 is provided on the first face 101a of the substrate 100a, and the at least one electrode 320 is provided on the second face 102a of the substrate 100a so as to overlap the at least one electrode 310 in plan view in the thickness direction T. In this case, the existence of the at least one electrode 320 reduces the possibility of unwanted electrostatic coupling of the at least one electrode 310 to a dielectric (such as a user's hand) or a metal member present on the opposite side of the sensor S from the first detection space E1.

(VIII) Where the electrode 310, or at least one of the electrodes 310 is divided into the plurality of sub-electrodes 311, even when the at least one electrode 310 is subjected to electromagnetic noise of a specific frequency coming from outside the sensor S, the sensor S is unlikely to malfunction, preventing unwanted change in a signal from the at least one electrode 310. Also, where the at least one electrode 320 is divided into the plurality of sub-electrodes 321, even when the at least one electrode 320 is subjected to electromagnetic noise of a specific frequency coming from outside the sensor S, the sensor S is unlikely to malfunction, preventing unwanted change in a signal from the single electrode 320 or from one of the electrodes 320.

It should be noted that the proximity sensor and the door handle device described above are not limited to the embodiments described above but may be modified in any manner within the scope of the claims.

The materials, the shapes, the dimensions, the numbers, the positions, etc. of the elements of the proximity sensor and the door handle device in the above-described embodiments and their variants are presented by way of example only and can be modified in any manner as long as the same functions can be fulfilled. The aspects and variants of the above-described embodiments can be combined in any possible manner.

The proximity sensor of the invention may be incorporated into a device other than the door handle device. The detection target of the invention is not limited to a user's hand but may be any object (for example, a metal or dielectric member) that can change the first capacitance of any aspect described above by approaching the first detection space.

The present invention can include any combination of these various features or embodiments above and/or below as set-forth in sentences and/or paragraphs. Any combination of disclosed features herein is considered part of the present invention and no limitation is intended with respect to combinable features.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

REFERENCE SIGNS LIST

D: door
H: door handle device
S: proximity sensor
100a: substrate (first substrate)
101a: first face
102a: second face
100b: substrate (second substrate)
101b: first face
102b: second face
100c: substrate (third substrate)
101c: first face
102c: second face
200: first connecting member
310: electrode (first electrode)
311: sub-electrode
320: electrode (third electrode)
321: sub-electrode
330: electrode (second electrode)
340: electrode (fourth electrode)
400: detection part
500: first encapsulating part
600: protective cover
610: column
700a: first housing
700b: second housing
800: second connecting member
900: second encapsulating part
E1: first detection space
E2: second detection space

What is claimed is:

1. A proximity sensor comprising:
a first substrate disposed in the vicinity of a first detection space;
a second substrate disposed on an opposite side of the first substrate to the first detection space, the second substrate facing the first substrate;
a first connecting member to connect the first substrate and the second substrate;

at least one first electrode provided on the first substrate, wherein a signal from the at least one first electrode changes in response to a change in a first capacitance caused by a detection target approaching to the first detection space; and a detection part being provided on the second substrate and configured to detect the approach of the detection target based on the signal from the at least one first electrode, wherein the first connecting member, in its entirety, is disposed within a projected area of at least one of the first and second substrates, in plan view in a thickness direction of the first substrate.

2. The proximity sensor according to claim 1, wherein the first connecting member is flexible.

3. The proximity sensor according to claim 2, further comprising:

a first encapsulating part; and a protective cover being fixed to the first encapsulating part and including at least one column, the at least one column extending through the second substrate and the first substrate, and wherein the first encapsulating part encapsulates the at least one first electrode, the detection part, the first substrate, the second substrate, the at least one column, and at least part of the first connecting member.

4. The proximity sensor according to claim 2, further comprising:

a first housing;

a second housing;

a first encapsulating part; and a protective cover fixed to the first encapsulating part, wherein the first encapsulating part encapsulates the at least one first electrode, the detection part, the first substrate, the second substrate, and at least part of the first connecting member, the first encapsulating part and the protective cover are held between, and pressed by, the first housing and the second housing, and the protective cover is located closer to the second housing than the first encapsulating part is.

5. The proximity sensor according to claim 2, further comprising:

at least one second electrode, wherein a signal from the at least one second electrode changes in response to a change in a second capacitance caused by a detection target approaching to the second detection space different from the first detection space; and first and second housings configured to house the at least one first electrode, the detection part, the first substrate, the second substrate, the first connecting member, and the at least one second electrode, wherein the first detection space is located outside the first housing, the second detection space is located outside the second housing, the detection part is configured to detect an approach of the detection target based on the signal from the at least one second electrode, and the at least one second electrode is fixed to, or in abutment with, a part of an inner face of the second housing that corresponds to the second detection space.

6. The proximity sensor according to claim 1, further comprising:

a first encapsulating part; and a protective cover being fixed to the first encapsulating part and including at least one column, the at least one column extending through the second substrate and the first substrate, and wherein the first encapsulating part encapsulates the at least one first electrode, the detection part, the first substrate, the second substrate, the at least one column, and at least part of the first connecting member.

7. The proximity sensor according to claim 6, wherein the at least one column of the protective cover is inserted through a through-hole of the first substrate and a through-hole of the second substrate, the first encapsulating part is made of an adhesive or a molded plastic material, and the at least one first electrode, the detection part, the first substrate, the second substrate, the at least one column, and at least part of the first connecting member are embedded in the first encapsulating part.

8. The proximity sensor according to claim 1, further comprising:

a first housing;

a second housing;

a first encapsulating part; and a protective cover fixed to the first encapsulating part, wherein the first encapsulating part encapsulates the at least one first electrode, the detection part, the first substrate, the second substrate, and at least part of the first connecting member, the first encapsulating part and the protective cover are held between, and pressed by, the first housing and the second housing, and the protective cover is located closer to the second housing than the first encapsulating part is.

9. The proximity sensor according to claim 1, further comprising:

at least one second electrode, wherein a signal from the at least one second electrode changes in response to a change in a second capacitance caused by a detection target approaching to the second detection space different from the first detection space; and first and second housings configured to house the at least one first electrode, the detection part, the first substrate, the second substrate, the first connecting member, and the at least one second electrode, wherein the first detection space is located outside the first housing, the second detection space is located outside the second housing, the detection part is configured to detect an approach of the detection target based on the signal from the at least one second electrode, and the at least one second electrode is fixed to, or in abutment with, a part of an inner face of the second housing that corresponds to the second detection space.

10. The proximity sensor according to claim 9, further comprising:

a third substrate provided with the at least one second electrode;

a second connecting member to connect the second substrate and the third substrate; and a second encapsulating part, wherein the second encapsulating part at least encapsulates a joint connecting the third substrate and the second connecting member.

11. The proximity sensor according to claim 1, further comprising:

at least one third electrode provided on the first substrate,
wherein a signal from the at least one first electrode changes in response to a change in the first capacitance between the at least one first electrode and the detection target and/or a change in the first capacitance between the at least one first electrode and the at least one third electrode.

12. The proximity sensor according to claim 11, wherein the first substrate has a first face facing the first detection space and a second face opposite to the first face,
the at least one first electrode is provided on the first face of the first substrate, and
the at least one third electrode is provided on the second face of the first substrate so as to overlap the at least one first electrode in plan view in a thickness direction of the first substrate.

13. The proximity sensor according to claim 1, wherein the first substrate has a first face facing the first detection space and a second face opposite to the first face of the first substrate, and
the second substrate has a first face facing the second face of the first substrate and a second face opposite to the first face of the second substrate.

14. The proximity sensor according to claim 13, wherein the first face of the second substrate faces, and is spaced from, the second face of the first substrate, and
the detection part is provided on the first face of the second substrate to be located between the first face of the second substrate and the second face of the first substrate.

15. The proximity sensor according to claim 13, wherein the first connecting member is disposed between the first face of the second substrate and the second face of the first substrate to be located within a projected area of at least one of the first and second substrates, in plan view in a thickness direction of the first substrate.

16. The proximity sensor according to claim 1, wherein the first connecting member is disposed between the first substrate and the second substrate.

17. The proximity sensor according to claim 16, further comprising:
a first encapsulating part; and
a protective cover being fixed to the first encapsulating part and including at least one column, the at least one column extending through the second substrate and the first substrate, and
wherein the first encapsulating part encapsulates the at least one first electrode, the detection part, the first substrate, the second substrate, the at least one column, and at least part of the first connecting member.

18. The proximity sensor according to claim 16, further comprising:
a first housing;
a second housing;
a first encapsulating part; and
a protective cover fixed to the first encapsulating part, wherein
the first encapsulating part encapsulates the at least one first electrode, the detection part, the first substrate, the second substrate, and at least part of the first connecting member,
the first encapsulating part and the protective cover are held between, and pressed by, the first housing and the second housing, and
the protective cover is located closer to the second housing than the first encapsulating part is.

19. The proximity sensor according to claim 16, further comprising:
at least one second electrode, wherein a signal from the at least one second electrode changes in response to a change in a second capacitance caused by a detection target approaching to the second detection space different from the first detection space; and
first and second housings configured to house the at least one first electrode, the detection part, the first substrate, the second substrate, the first connecting member, and the at least one second electrode, wherein
the first detection space is located outside the first housing,
the second detection space is located outside the second housing,
the detection part is configured to detect an approach of the detection target based on the signal from the at least one second electrode, and
the at least one second electrode is fixed to, or in abutment with, a part of an inner face of the second housing that corresponds to the second detection space.

20. A door handle device configured to be fixed to a door, the door handle device comprising the proximity sensor according to claim 1,
wherein the first detection space is located between the door and the door handle device.

* * * * *